(12) United States Patent
Anand et al.

(10) Patent No.: US 7,688,654 B2
(45) Date of Patent: *Mar. 30, 2010

(54) STRUCTURE FOR DIFFERENTIAL EFUSE SENSING WITHOUT REFERENCE FUSES

(75) Inventors: Darren Lane Anand, Essex Junction, VT (US); John Atkinson Fifield, Underhill, VT (US); Michael Richard Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 438 days.

This patent is subject to a terminal disclaimer.

(21) Appl. No.: 11/769,925

(22) Filed: Jun. 28, 2007

(65) Prior Publication Data

US 2008/0001251 A1    Jan. 3, 2008

Related U.S. Application Data

(63) Continuation-in-part of application No. 11/427,849, filed on Jun. 30, 2006, now Pat. No. 7,477,555.

(51) Int. Cl.
*G11C 11/063* (2006.01)

(52) U.S. Cl. .................. 365/196; 365/96; 365/225.7; 365/94

(58) Field of Classification Search .............. 365/196, 365/96, 225.7, 94
See application file for complete search history.

(56) References Cited

U.S. PATENT DOCUMENTS

| | | | |
|---|---|---|---|
| 6,330,204 B1 | 12/2001 | Miyagi | |
| 7,061,304 B2 | 6/2006 | Anand et al. | |
| 7,224,633 B1* | 5/2007 | Hovis et al. | 365/225.7 |
| 7,271,644 B2 | 9/2007 | Lin et al. | |
| 2004/0227562 A1 | 11/2004 | Kuroki | |
| 2005/0052892 A1 | 3/2005 | Low et al. | |
| 2005/0216220 A1 | 9/2005 | Kim | |
| 2006/0152990 A1 | 7/2006 | Huang | |
| 2007/0133333 A1 | 6/2007 | Hovis et al. | |

* cited by examiner

*Primary Examiner*—Vu A Le
*Assistant Examiner*—Han Yang
(74) *Attorney, Agent, or Firm*—Cantor Colburn LLP; Riyon Harding

(57) ABSTRACT

A design structure comprising a differential fuse sensing system, which includes a fuse leg configured for introducing a sense current through an electrically programmable fuse (eFUSE) to be sensed, and a differential sense amplifier having a first input node coupled to the fuse leg and a second node coupled to a reference voltage. The fuse leg further includes a current supply device controlled by a variable reference current generator configured to generate an output signal therefrom such that the voltage on the first input node of the sense amplifier is equal to the voltage on the second input node of the sense amplifier whenever the resistance value of the eFUSE is equal to the resistance value of a programmable variable resistance device included within the variable reference current generator.

21 Claims, 4 Drawing Sheets

STRUCTURE FOR DIFFERENTIAL EFUSE SENSING WITHOUT REFERENCE FUSES

CROSS-REFERENCE TO RELATED APPLICATIONS

This non-provisional U.S. patent application is a continuation in part of U.S. patent application Ser. No. 11/427,849, which was filed Jun. 30, 2006 now U.S. Pat. No. 7,477,555 and is assigned to the present assignee.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to semiconductor devices, and particularly to a design structure, which enables a differential eFUSE (Electrically Programmable Fuse) sense without the use of a reference fuse(s).

2. Description of Background

Electrically Programmable Fuses (eFUSEs) are widely used to implement memory redundancy functionality in dynamic random access memory (DRAM), static random access memory (SRAM), and embedded memory devices. Passing a sufficient current through an eFUSE structure typically programs the eFUSE, such that its resistance is significantly altered from its initially fabricated state. In order to determine whether a particular fuse has been programmed or not, a sense circuit may be used to detect one of two possible "states" of the fuse. More specifically, the sense circuit holds one of two latched values therein, which is determined by a comparison between a voltage developed by the sense circuit across the fuse and a reference voltage generated within the sense circuit. The reference voltage is designed to be between a fuse voltage corresponding to the programmed state and a fuse voltage corresponding to an unprogrammed state. However, eFUSEs with small changes in resistivity between programmed and unprogrammed states are difficult to sense reliably with a single ended fuse latch.

Instead, a fuse sense device with higher gain and better discrimination is desirable to sense changes in resistance of a few hundred ohms. Conventional solutions have been proposed which use a first fuse, or resistive element as a reference device to which a fuse undergoing sensing is compared. This approach is operable but requires two fuses per bit, which reduces fuse bay density. Additionally, it is required to test for a fuse-blow margin and a conventional two fuse sensing system does not provide a means for margin testing. Two-element fuse sense systems have been proposed for the CMOS (Complementary Metal Oxide Semiconductor) technology but do not have margin test capabilities.

Considering the limitations of the above-mentioned methods, it is clear that there is a need for a method for detecting a state of an electronic fuse that does not utilize a two fuse sensing system.

SUMMARY OF THE INVENTION

The shortcomings of the prior art are overcome and additional advantages are provided through a design structure for differential fuse sensing system. In an exemplary embodiment, the design structure includes a fuse leg configured for introducing a sense current through an electrically programmable fuse (eFUSE) to be sensed, and a differential sense amplifier having a first input node coupled to the fuse leg and a second node coupled to a reference voltage. The fuse leg further includes a current supply device controlled by a variable reference current generator configured to generate an output signal therefrom such that the voltage on the first input node of the sense amplifier is equal to the voltage on the second input node of the sense amplifier whenever the resistance value of the eFUSE is equal to the resistance value of a programmable variable resistance device included within the variable reference current generator.

In another embodiment, a differential fuse sensing design structure includes a fuse leg configured for introducing a sense current through an electrically programmable fuse (eFUSE) to be sensed, and a differential sense amplifier having a first input node coupled to the fuse leg, a second node coupled to a reference voltage, and a pair of ballast capacitors coupled to the first and second input nodes. The fuse leg further includes a current supply device controlled by a variable reference current generator configured to generate an output signal therefrom such that the voltage on the first input node of the sense amplifier is equal to the voltage on the second input node of the sense amplifier whenever the resistance value of the eFUSE is equal to the resistance value of a programmable variable resistance device included within the variable reference current generator. The variable reference current generator further includes a differential amplifier having the reference voltage as an inverting input thereto, a mimic circuit configured to mimic devices of the fuse leg, wherein an internal node of the mimic circuit is coupled to a non-inverting input of the differential amplifier, and a digitally controlled, variable resistance device, a resistance portion of which is configured within the mimic circuit, wherein an output of the differential amplifier corresponds to the output signal used to control the current supply device of the fuse leg.

In still another embodiment, a method for differential sensing of an electrically programmable fuse (eFUSE) includes configuring a fuse leg including the eFUSE to be sensed, and coupling a first input node of a differential sense amplifier to the fuse leg and a second node of the differential sense amplifier to a reference voltage. A variable reference current generator is configured to generate an output signal therefrom that controls a current supply device within the fuse leg, the output signal generated in a manner such that the voltage on the first input node of the sense amplifier is equal to the voltage on the second input node of the sense amplifier whenever the resistance value of the eFUSE is equal to the resistance value of a programmable variable resistance device included within the variable reference current generator.

Additional features and advantages are realized through the techniques of the present invention. Other embodiments and aspects of the invention are described in detail herein and are considered a part of the claimed invention. For a better understanding of the invention with advantages and features, refer to the description and the drawings.

TECHNICAL EFFECTS

As a result of the summarized invention a solution is technically achieved that provides for a method for detecting a state of an electronic fuse that uses an adjustable reference current and a reference voltage.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
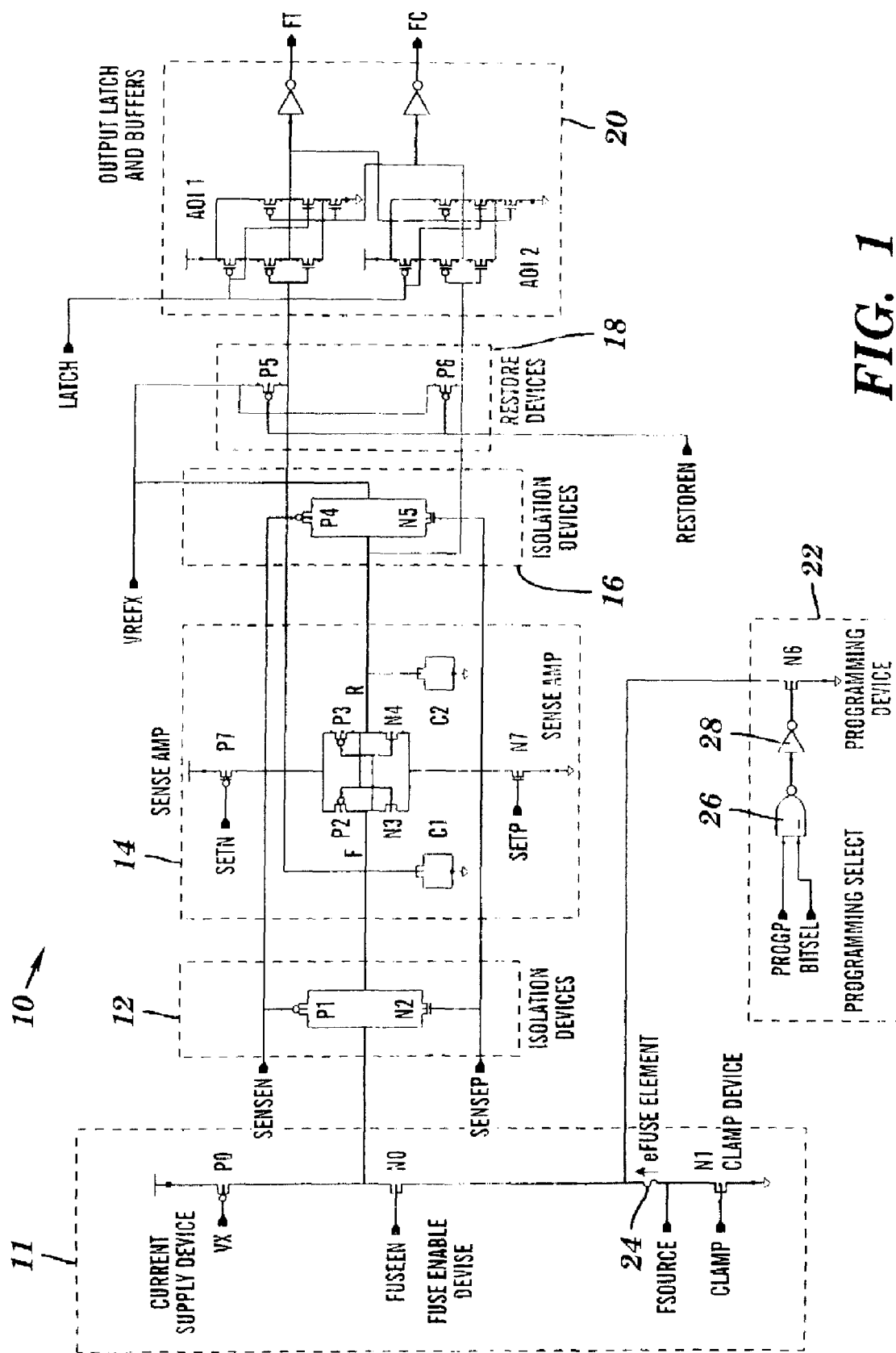
FIG. 1 is a schematic diagram of a differential eFUSE sense circuit without reference fuses, in accordance with an embodiment of the invention.

One aspect of the exemplary embodiments is to provide a means for differential sensing of an eFUSE element. Another aspect of the exemplary embodiments is a method for detecting a state of an electronic fuse that uses an adjustable reference current and a reference voltage. Still another aspect is to provide a differential fuse latch device with a means for fuse resistance margin testing.

A differential sensing and margin testing fuse latch and control circuit is used as a dense and accurate means to detect the state of an electronic fuse. The exemplary embodiments of the present invention do not use a reference fuse, but rather an adjustable reference current and a reference voltage. By providing such configuration, density is improved by elimination of a reference resistor for sensing of an electronic fuse. Margin testing is possible by adjustment of the reference current. The accuracy of resistance measurement is on the order of about +/−100 ohms. Exemplary embodiments of the present invention are described in detail hereinafter with reference to FIGS. 1 and 2.

The detailed description includes several terms described herein as follows. "VXGEN" refers to a calibrated adjustable reference current generator that outputs "VX," a signal that is used to control the fuse sense trip point. In other words, VXGEN is a circuit providing a current reference for a fuse sensing circuit, which is also referred to herein as the bit cell. The level of VX is responsive to the setting of a digitally controlled variable reference resistor. This resistive reference sets the threshold point, or trip point of the fuse sensing circuit. Fuses measuring above this resistance are sensed as open (i.e., programmed or blown). The digitally controlled reference resistance circuit includes various selectable resistors used to generate a reference resistance to which the fuses are compared.

"VREFX" refers to a fixed reference voltage used by the differential sense amp (SA) circuit to read or evaluate the fuse state. In an exemplary embodiment, VREFX is generated by a circuit, such as a resistor divider, for example, which provides a voltage reference used by the sense amp in the bit cell. A pair of ballast capacitors are attached between the differential sense nodes of the sense amp and ground. The use of ballast capacitors increases the charge to be differentially sensed and facilitates more reliable sensing.

A "blow-FET" is an FET device used to direct a programming current through an eFUSE. When a blow-FET is enabled, it permits a high voltage from input "FSOURCE" to develop a programming current through the selected eFUSE. The programming current is of a magnitude sufficient to cause structural changes within the eFUSE which result in a change in resistance. Specifically, fuses start out in the intact or "zero-state." To change the fuse to a "one-state" (opposite state), the fuse is blown or programmed. The device that programs the fuse is referred to as the "blow-FET" or a "programming device." In an exemplary embodiment, this device is an NFET device (N type Field Effect Transistor Metal Oxide Semiconductor). A programmed fuse has its electrical resistance increase over its initial unprogrammed resistance.

As used herein, "AOI" stands for "And Or Invert" and is a common logical operation in circuit design. It ANDs inputs, then ORs that result with other inputs, and then inverts the result of the OR operation. "Mimic" refers to a duplicate or dummy copy of a circuit element. The duplicate or replica is used to obtain information about the other copies of the circuit. In the exemplary embodiments of the present invention, a copy of the current path from power supply Vdd, through the fuse to ground is provided using a "mimic" structure within the VXGEN circuit.

Referring now to FIG. 1, there is shown a schematic diagram illustrating one example of a design structure for a differential eFUSE sense circuit 10 (fuse bit cell) without reference fuses, in accordance with an embodiment of the invention. The differential eFUSE sense circuit or fuse bit cell 10 includes a fuse leg 11, a first set of isolation devices 12, a sense amp 14, a second set of isolation devices 16, restore devices 18, an output latch and buffers 20, a programming device 22.

As described in further detail below, the fuse leg 11 includes a current supply device (PFET) P0, fuse enable device (NFET) N0, eFUSE element 24 and clamp device NFET N1. The first set of isolation devices 12 includes a PFET P1 and an NFET N2. The second set of isolation devices 16 includes a PFET P4 and an NFET N5. The first set of isolation devices 12 and the second set of isolation devices 16 are driven by complementary inputs SENSEN and SENSEP. SENSEN drives the PFETs P1 and P4 while SENSEP drives NFETs N2 and N5.

The sense amp 14 includes a first ballast capacitor C1, a second ballast capacitor C2, a SETP input to an NFET N7, and a SETN input to a PFET P7. The first ballast capacitor C1 is associated with P2 and N3 while the second ballast capacitor C2 is associated with P3 and N4. As will thus be recognized, P2, N3, P3 and N4 form a cross coupled latch for sensing a differential signal between nodes F and R, and latching a logical value therein upon activation of P7 and N7. The first set of isolation devices 12 and the second set of isolation devices 16 of the sense amp 14 are used to respectively pass a fuse leg voltage and the reference voltage VREFX onto the ballast capacitors C1 and C2 to establish a voltage difference proportional to the relative difference between a fuse resistance and a reference resistance.

The restore devices 18 include a pair of FETs P5, P6, coupled to reference voltage VREFX. VREFX is supplied from a low impedance voltage source (not shown) and is common to a group of, for example, 128 fuse bit cells. The restore devices 18 have a RESTOREN input for enabling the pair of FETs P5, P6 to precharge the sense amp nodes F, R to VREFX prior to sensing.

The output latch and buffers 20 includes a first AOI configuration (AOI1), a second AOI configuration (AOI2), a first inverter output (FT), and a second inverter output (FC). The output latch and buffers 20 are formed by AOI configurations AOI1, AOI2, which have the property, once latched, of preventing an intermediate analog voltage, or the sense latch restore level from altering the state of the digital '1' or '0' level stored within. The AOI configurations AOI1, AOI2 have a LATCH signal input thereto.

The programming device 22 includes a PROGP input, a BITSEL input, a NAND gate 26, and an inverter 28 connected to an NFET N6. A selected eFUSE (e.g., eFUSE 24) is programmed by current flowing from FSOURCE, through the eFUSE 24, through NFET N6 to ground. NFET N6 is activated (conductive) when control signals PROGP and BITSEL are logical high. FSOURCE is held at ground and clamp input CLAMP is held high after programming is complete.

The fuse leg 11 is energized by several inputs. These inputs include VX to the current supply device P0, FUSEEN to the fuse enable device N0, FSOURCE, and CLAMP to the clamp device N1. The current supply device P0 has its gate connected to VX (the generation of which is described in further detail below) and its drain coupled to the drain of the fuse enable device N0. In turn, the fuse enable device N0 has its source connected to the cathode of the eFUSE element 24.

The fuse enable device N0 functions as a switch to pass current from P0 to the eFUSE element 24 when fuses are to be read. Additionally, N0 provides pre-amplification of the fuse voltage developed on the eFUSE cathode node. As sense current from P0 flows through the eFUSE element, a fuse voltage develops on the cathode node which reduces the overdrive Vgs (Vgate-to-source) and transconductance of N0 causing the drain of N0 to rise. Consequently, a change in N0 source voltage may result in a change in drain voltage by a factor of 2-10 and serves to preamplify the cathode fuse voltage to enhance sensing accuracy.

The anode of the eFUSE element 24 is in turn connected to the FSOURCE input and the drain of the clamp device N1. The source of the clamp device N1 is connected to ground. The current supply device P0 injects a predetermined level of current through the eFUSE element 24 such that the voltage on node F of sense amp 14 equals the voltage (VREFX) on node R of sense amp 14 when the resistance of the eFUSE element 24 is equal to a reference resistance as described below. This fuse current is generated by the VXGEN circuit (described below in FIG. 2) and its output is distributed to all the fuse bit cells by current mirroring techniques.

Once current is applied by the current supply device P0, a differential signal is developed and stored on the two ballast capacitors C1, C2 of the sense amp 14 and the isolation devices 12, 16 are then shut off. The isolation devices allow the sense amp 14 to amplify the established differential voltage on nodes F and R. The sense amp 14 is then set to the full rail voltage by activation of the SETN and SETP inputs and the LATCH signal transfers sense amp data to the digital AOI configurations AOI1, AOI2. Once data is stored in the AOI configurations AOI1, AOI2 and the LATCH signal is held inactive (HIGH), any intermediate voltage levels from the sense amp 14 do not disturb the stored digital data, or cause a current burn condition. Further, the VREFX level cannot alter the latch state, since whenever the input signal LATCH is "1", or latched state, the inputs to the AOI latch are completely isolated from the cross-coupled latch nodes. This is a special attribute of the AOI latch and offers an advantage over use of a NAND latch or a simple inverter latch. Moreover, once the fuse data is stored in the AOI latch configuration, it will remain there so long as $V_{DD}$ power is maintained.

Figure 2:
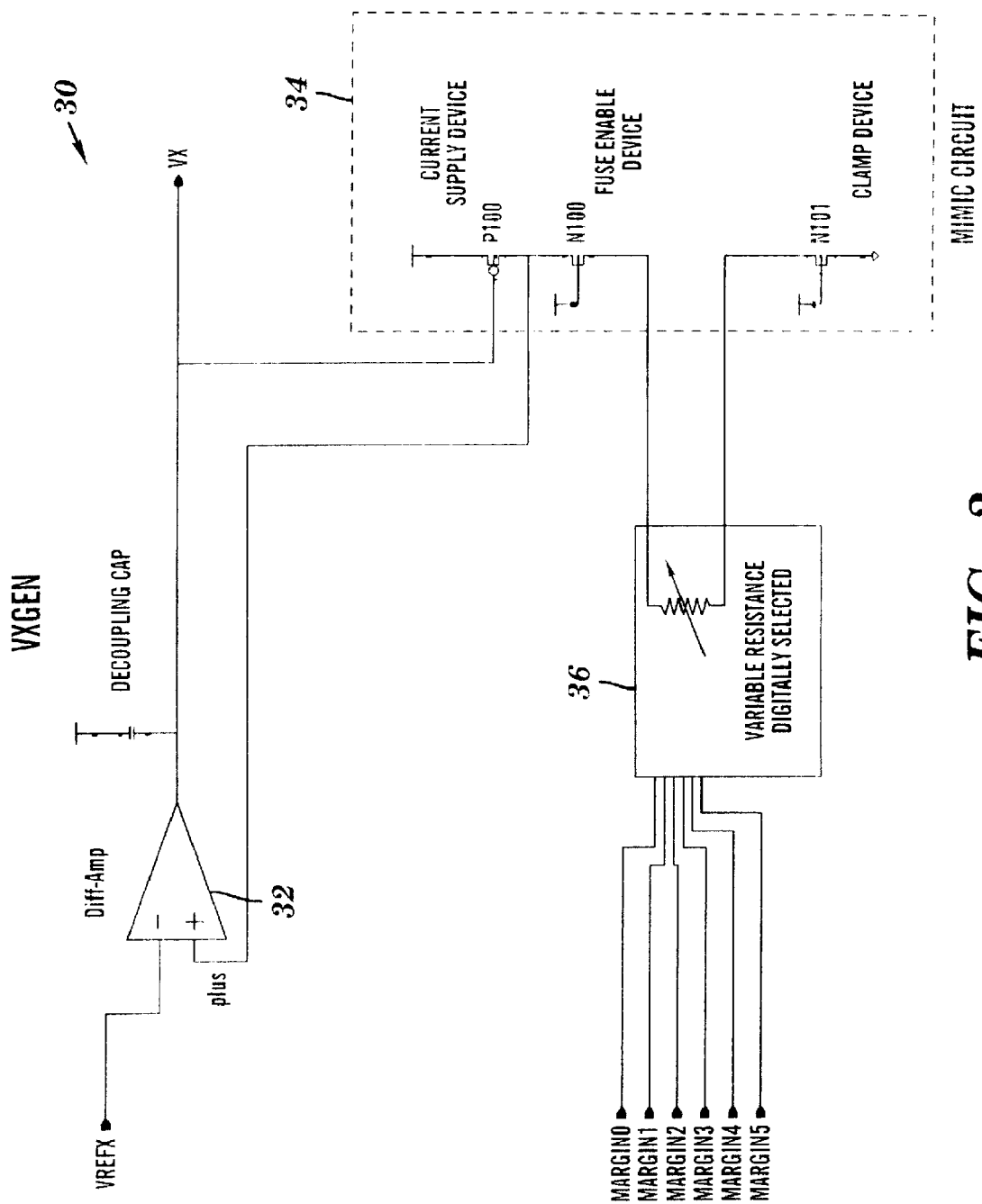
FIG. 2 is a schematic diagram illustrating one example of an adjustable reference current generator utilized by the differential eFUSE sense circuit of FIG. 1, in accordance with a further embodiment of the invention.

Referring now to FIG. 2, there is shown a schematic diagram illustrating one example of an adjustable reference current generator (VXGEN) 30 utilized by the differential eFUSE sense circuit 10 of FIG. 1, in accordance with a further embodiment of the invention. In particular, VXGEN 30 includes a differential amplifier 32 having a pair of inputs: the first input to the negative (inverting) terminal is the VREFX input shown in FIG. 1, and the second input ("plus") to the positive (non-inverting) terminal is a node within a mimic circuit 34. The output of the differential amplifier 32 (connected to a decoupling capacitor) is the control signal VX, used to control the current supply device P0 of FIG. 1. The mimic circuit 34 mimics the fuse leg 11 of FIG. 1, wherein P100 mimics the current supply device P0; N100 mimics the fuse enable device N0, and N101 mimics the clamp device N1. Accordingly, the "plus" node of FIG. 2 (being connected between the mimic current supply device P100 and the mimic fuse enable device N100) mimics input node F of the sense amplifier 12 in FIG. 1.

As also shown in FIG. 2, VXGEN 30 further includes a digitally controlled, variable resistance device 36. The variable resistance device 36 is coupled between the mimic fuse enable device N100 and the mimic clamp device N101 of the mimic circuit 34, which is analogous to the location of the eFUSE element 24 in the fuse leg 11 of FIG. 1. In an exemplary embodiment, selection of the value of the variable resistance device 36 is implemented through six bits of resolution (MARGIN 0-MARGIN 5), although a higher or lower degree of resistance value granularity can be used.

From a functional standpoint, VXGEN calculates an appropriate value of VX (applied to the gate of current supply device P0 in FIG. 1) such that the voltage appearing on sense amp node F and R of FIG. 1 are equal whenever the resistance of the eFUSE element 24 is equal to the value of the variable resistance device 36 in VXGEN. Consequently, a selectable resistive trip point for the eFUSE element 24 is created.

By way of example, VXGEN 30 permits fuse sensing of a trip point of 1000Ω. A trip point is the threshold or boundary at which the sense circuit 10 determines a fuse to be in the '0' or '1' state. Again, eFUSEs are elements that have a low resistance when intact (e.g., about 200Ω). After programming, the resistance may only increase by a few hundred ohms. The trip point is the resistance where a sense latch switches from detecting a '0' to a '1'. If the trip-point (or sense threshold) is at 1000Ω, then any fuse having a resistance below 1000Ω is considered in the '0' state and any fuse having a resistance above 1000Ω is considered in the '1' state.

Thus configured, FIGS. 1 and 2 provide for an eFUSE circuit that is capable of detecting slight resistance variances in a dependable and repeatable manner. As a result, eFUSEs with small changes in resistivity between programmed and unprogrammed states may be sensed reliably through the exemplary embodiments discussed above. By providing such configurations, density is also improved by elimination of a reference resistor for sensing of an electronic fuse. Margin testing is further possible through adjustment of the reference current, wherein the accuracy of the resistance measurement is on the order of about ±100Ω. Immunity from burning excess current is also provided by the use of the AOI latch.

Figure 3:
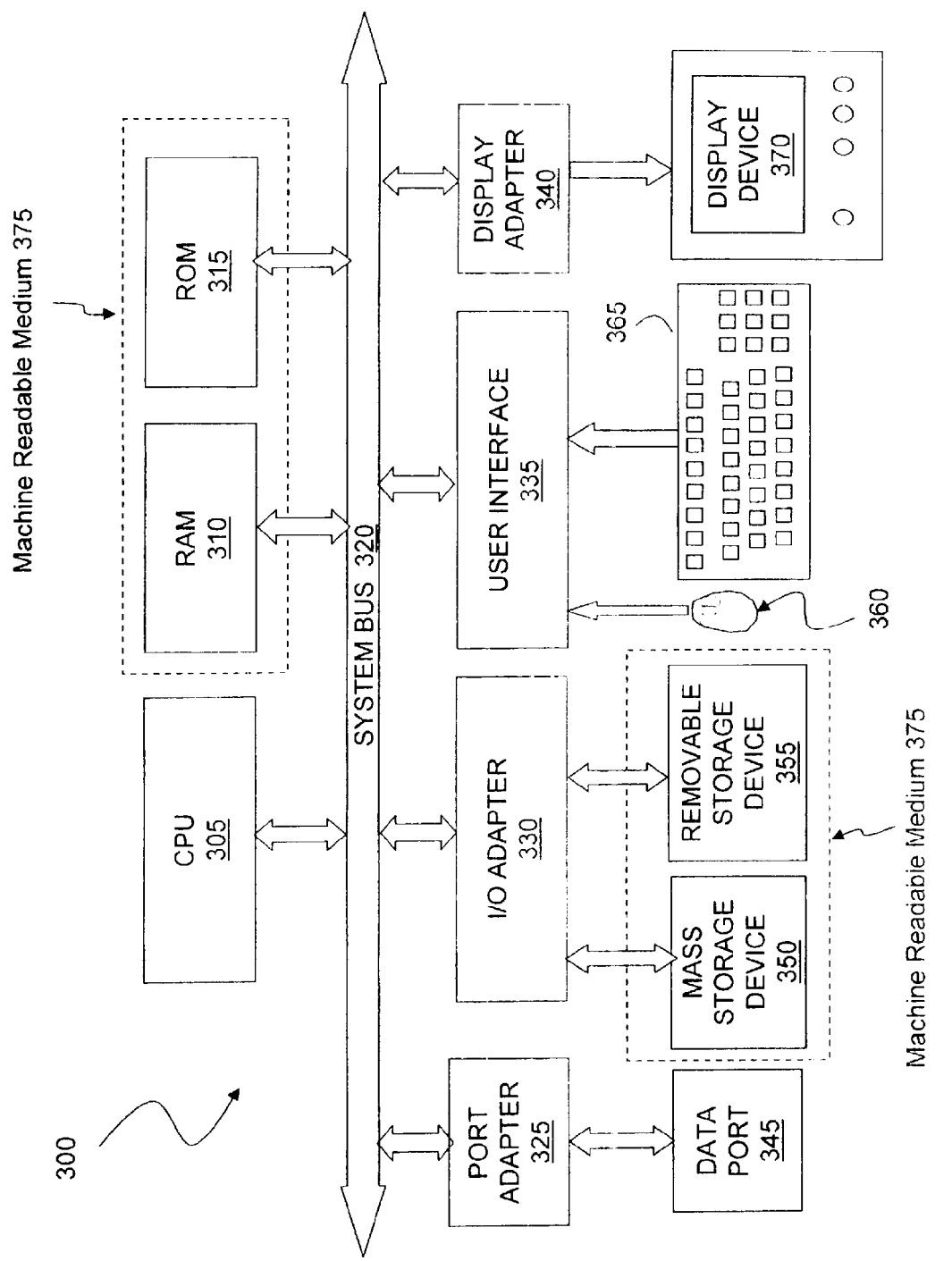
FIG. 3 is a block diagram of an example general computer system which may be used to practice the invention.

FIG. 3 illustrates a block diagram of a general-purpose computer system which can be used to implement the circuit and circuit design structure described herein. The design structure may be coded as a set of instructions on removable or hard media for use by general-purpose computer. FIG. 3 is a schematic block diagram of a general-purpose computer for practicing the present invention. FIG. 3 shows a computer system 300, which has at least one microprocessor or central processing unit (CPU) 305. CPU 305 is interconnected via a system bus 320 to machine readable media 375, which includes, for example, a random access memory (RAM) 310, a read-only memory (ROM) 315, a removable and/or program storage device 355 and a mass data and/or program storage device 350. An input/output (I/O) adapter 330 connects mass storage device 350 and removable storage device 355 to system bus 320. A user interface 335 connects a keyboard 365 and a mouse 360 to system bus 320, and a port adapter 325 connects a data port 345 to system bus 320 and a display adapter 340 connect a display device 370. ROM 315 contains the basic operating system for computer system 300. Examples of removable data and/or program storage device 355 include magnetic media such as floppy drives, tape drives, portable flash drives, zip drives, and optical media such as CD ROM or DVD drives. Examples of mass data and/or program storage device 350 include hard disk drives and non-volatile memory such as flash memory. In addition to keyboard 365 and mouse 360, other user input devices such as trackballs, writing tablets, pressure pads, microphones, light pens and position-sensing screen displays may be connected to user interface 335. Examples of display device 370 include cathode-ray tubes (CRT) and liquid crystal displays (LCD).

A machine readable computer program may be created by one of skill in the art and stored in computer system 300 or a data and/or any one or more of machine readable medium 375 to simplify the practicing of this invention. In operation, information for the computer program created to run the present invention is loaded on the appropriate removable data and/or program storage device 355, fed through data port 345 or entered using keyboard 365. A user controls the program by manipulating functions performed by the computer program and providing other data inputs via any of the above mentioned data input means. Display device 370 provides a means for the user to accurately control the computer program and perform the desired tasks described herein.

Figure 4:
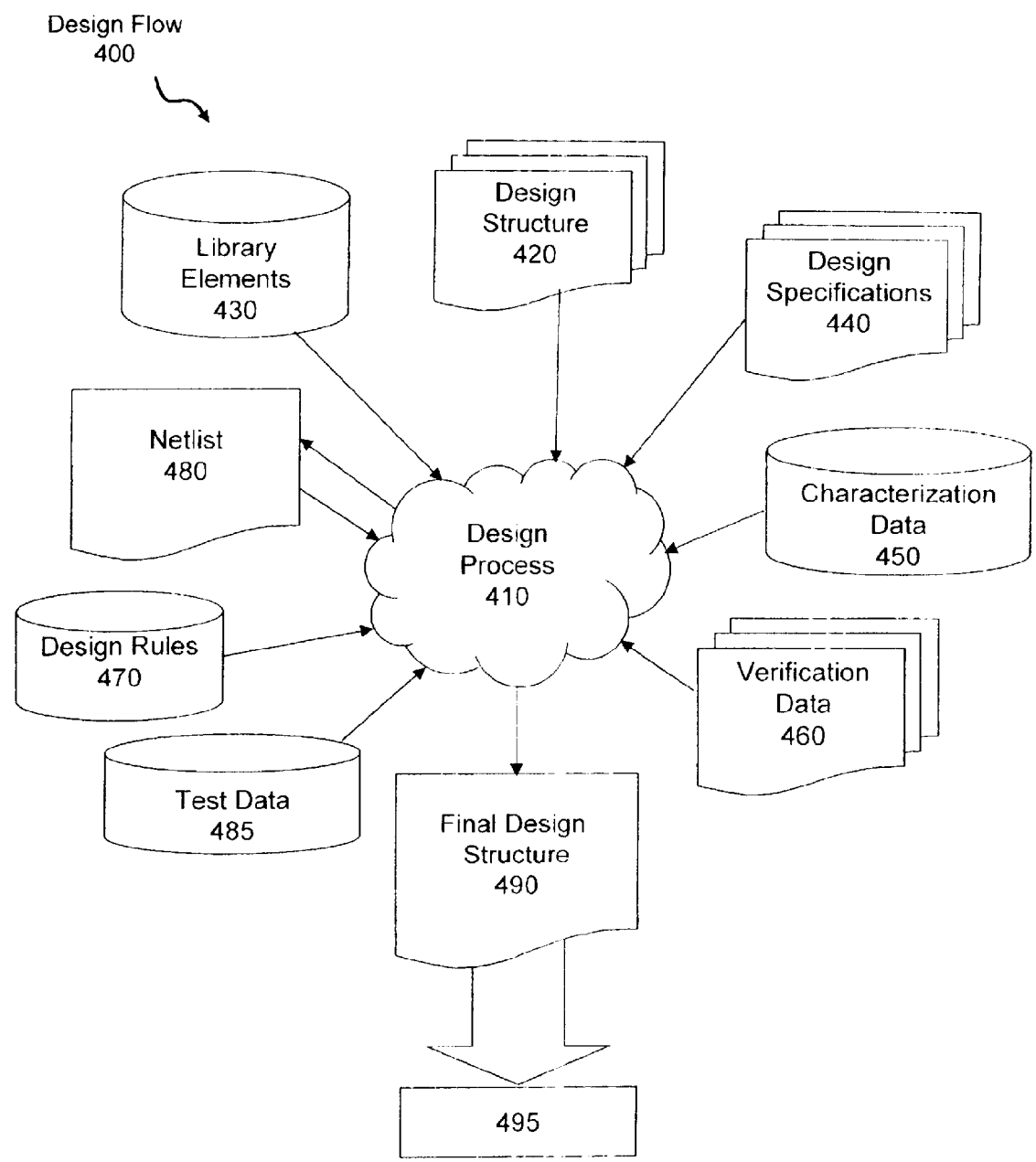
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) will differ from a design flow 400 for designing a standard component. Design structure 420 is an input to a design process 410 and may come from an IP provider, a core developer, or other design company. Design structure 420 comprises differential eFUSE sense circuit 10 in the form of schematics or HDL, a hardware-description language, (e.g., Verilog, VHDL, C, etc.). Design structure 420 may be on one or more of machine readable medium 375 as shown in FIG. 3. For example, design structure 420 may be a text file or a graphical representation of circuit 100. Design process 410 synthesizes (or translates) differential eFUSE sense circuit 10 into a netlist 480, where netlist 480 is, for example, a list of wires, transistors, logic gates, control circuits, I/O, models, etc. and describes the connections to other elements and circuits in an integrated circuit design and recorded on at least one of machine readable medium 375.

Design process 410 includes using a variety of inputs; for example, inputs from library elements 430 which may house a set of commonly used elements, circuits, and devices, including models, layouts, and symbolic representations, for a given manufacturing technology (e.g. different technology nodes, 32 nm, 45 nm, 90 nm, etc.), design specifications 440, characterization data 450, verification data 460, design rules 470, and test data files 485, which may include test patterns and other testing information. Design process 410 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 410 without deviating from the scope and spirit of the invention.

Ultimately design process 410 translates differential eFUSE sense circuit 10, along with the rest of the integrated circuit design (if applicable), into a final design structure 490 (e.g., information stored in a GDS storage medium). Final design structure 490 may comprise information such as, for example, test data files, eFuse programming data files, design content files, manufacturing data, layout parameters, wires, levels of metal, vias, shapes, test data, data for routing through the manufacturing line, and any other data required by a semiconductor manufacturer to produce differential eFUSE sense circuit 10. Final design structure 490 may then proceed to a stage 495 of design flow 400; where stage 495 is, for example, where final design structure 490: proceeds to tape-out, is released to manufacturing, is sent to another design house or is sent back to the customer.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A design structure embodied in a machine readable medium used in a design process, the design structure comprising: a fuse leg configured for introducing a sense current through an electrically programmable fuse (eFUSE) to be sensed; and a differential sense amplifier having a first input node coupled to the fuse leg and a second node coupled to a reference voltage; the fuse leg further comprising a current supply device controlled by a variable reference current generator configured to generate an output signal therefrom such that the voltage on the first input node of the sense amplifier is equal to the voltage on the second input node of the sense amplifier whenever the resistance value of the eFUSE is equal to the resistance value of a programmable variable resistance device included within the variable reference current generator a first pair of isolation devices configured between the fuse leg and the first input node of the sense amplifier and a second pair of isolation devices configured between the reference voltage and the second input node of the sense amplifier, the first and second pair of isolation devices configured to establish, within the sense amplifiers, voltage difference proportional to the relative difference between the resistance of the eFUSE and a reference resistance defined by the digitally controlled, variable resistance device.

2. A design structure embodied in a machine readable medium used in a design process, the design structure comprising: a fuse leg configured for introducing a sense current through an electrically programmable fuse (eFUSE) to be sensed; and a differential sense amplifier having a first input node coupled to the fuse leg and a second node coupled to a reference voltage; the fuse leg further comprising a current supply device controlled by a variable reference current generator configured to generate an output signal therefrom such that the voltage on the first input node of the sense amplifier is equal to the voltage on the second input node of the sense amplifier whenever the resistance value of the eFUSE is equal to the resistance value of a programmable variable resistance device included within the variable reference current generator wherein the sense amplifier further comprises a pair of ballast capacitors coupled to the first and second input nodes of the sense amplifier, the pair of ballast capacitors configured to retain a signal proportional to the relative difference between the resistance of the eFUSE and a reference resistance once the first and second input nodes of the sense amplifier are respectively decoupled from the fuse leg and reference voltage.

3. A design structure embodied in a machine readable medium used in a design process, the design structure comprising: a fuse leg configured for introducing a sense current through an electrically programmable fuse (eFUSE) to be sensed; and a differential sense amplifier having a first input node coupled to the fuse leg and a second node coupled to a reference voltage; the fuse leg further comprising a current supply device controlled by a variable reference current generator configured to generate an output signal therefrom such that the voltage on the first input node of the sense amplifier is equal to the voltage on the second input node of the sense amplifier whenever the resistance value of the eFUSE is equal to the resistance value of a programmable variable resistance device included within the variable reference current generator a pair of restore devices configured to precharge the first and second input nodes of the sense amplifier to the reference voltage prior to sensing of the programmed state of the eFUSE.

4. The design structure of claim 1, wherein the design structure comprises a netlist describing a differential fuse sensing system.

5. The design structure of claim 1, wherein the design structure resides on a GDS storage medium.

6. The design structure of claim 1, wherein the design structure includes test data files, characterization data, verification data, programming data, or design specifications.

7. The design structure of claim 1, wherein the variable reference current generator further comprises:
   a differential amplifier having the reference voltage as an inverting input thereto;
   a mimic circuit configured to mimic devices of the fuse leg, wherein an internal node of the mimic circuit is coupled to a non-inverting input of the differential amplifier; and
   a digitally controlled, variable resistance device, a resistance portion of which is configured within the mimic circuit;
   wherein an output of the differential amplifier corresponds to the output signal used to control the current supply device of the fuse leg.

8. The design structure of claim 1, further comprising And Or Invert (AOI) output stages coupled to the first and second input nodes of the sense amplifier, the AOI output stages configured to maintain a digital state of the eFUSE data therein, regardless of any subsequent fluctuations in the voltage values of the first and second input nodes of the sense amplifier and/or the reference voltage.

9. The design structure of claim 1, further comprising a programming device coupled to the fuse leg, the programming device selectively configured to pass a programming current through the eFUSE.

10. The design structure of claim 2, wherein the design structure comprises a netlist describing a differential fuse sensing system.

11. The design structure of claim 2, wherein the design structure resides on a GDS storage medium.

12. The design structure of claim 2, wherein the design structure includes test data files, characterization data, verification data, programming data, or design specifications.

13. The design structure of claim 2, wherein the variable reference current generator further comprises:
   a differential amplifier having the reference voltage as an inverting input thereto;
   a mimic circuit configured to mimic devices of the fuse leg, wherein an internal node of the mimic circuit is coupled to a non-inverting input of the differential amplifier; and
   a digitally controlled, variable resistance device, a resistance portion of which is configured within the mimic circuit;
   wherein an output of the differential amplifier corresponds to the output signal used to control the current supply device of the fuse leg.

14. The design structure of claim 2, further comprising And Or Invert (AOI) output stages coupled to the first and second input nodes of the sense amplifier, the AOI output stages configured to maintain a digital state of the eFUSE data therein, regardless of any subsequent fluctuations in the voltage values of the first and second input nodes of the sense amplifier and/or the reference voltage.

15. The design structure of claim 2, further comprising a programming device coupled to the fuse leg, the programming device selectively configured to pass a programming current through the eFUSE.

16. The design structure of claim 3, wherein the design structure comprises a netlist describing a differential fuse sensing system.

17. The design structure of claim 3, wherein the design structure resides on a GDS storage medium.

18. The design structure of claim 3, wherein the design structure includes test data files, characterization data, verification data, programming data, or design specifications.

19. The design structure of claim 3, wherein the variable reference current generator further comprises:
   a differential amplifier having the reference voltage as an inverting input thereto;
   a mimic circuit configured to mimic devices of the fuse leg, wherein an internal node of the mimic circuit is coupled to a non-inverting input of the differential amplifier; and
   a digitally controlled, variable resistance device, a resistance portion of which is configured within the mimic circuit;
   wherein an output of the differential amplifier corresponds to the output signal used to control the current supply device of the fuse leg.

20. The design structure of claim 3, further comprising And Or Invert (AOI) output stages coupled to the first and second input nodes of the sense amplifier, the AOI output stages configured to maintain a digital state of the eFUSE data therein, regardless of any subsequent fluctuations in the voltage values of the first and second input nodes of the sense amplifier and/or the reference voltage.

21. The design structure of claim 3, further comprising a programming device coupled to the fuse leg, the programming device selectively configured to pass a programming current through the eFUSE.

* * * * *